US006654917B1

(12) United States Patent
Floyd et al.

(10) Patent No.: US 6,654,917 B1
(45) Date of Patent: Nov. 25, 2003

(54) METHOD AND APPARATUS FOR SCANNING FREE-RUNNING LOGIC

(75) Inventors: Michael Stephen Floyd, Leander, TX (US); Kevin F. Reick, Austin, TX (US); Timothy M. Skergan, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 09/657,106

(22) Filed: Sep. 7, 2000

(51) Int. Cl.[7] .............................................. G01R 31/28
(52) U.S. Cl. ..................................................... 714/726
(58) Field of Search ................................. 714/726, 727; 326/16; 327/293

(56) References Cited

U.S. PATENT DOCUMENTS 5,812,562 A  *  9/1998  Baeg ........................... 714/726
6,018,815 A  *  1/2000  Baeg ........................... 714/726
6,260,166 B1 *  7/2001  Bhavsar et al. ............. 714/727

* cited by examiner

Primary Examiner—Albert Decady
Assistant Examiner—Shelly A Chase
(74) Attorney, Agent, or Firm—Duke W. Yee; Casimer K. Salys; Stephen R. Tkacs

(57) ABSTRACT

A method and apparatus for scanning the test and diagnostics control logic on a chip maintains the state of the chip in a frozen state as the scan of the normally free-running logic occurs. The chip is configured to select the test and diagnostics control logic if an instruction to scan the test and free-running logic is in the instruction register. A scan switch is configured to pass the scan output from the free-running logic to the test data output on the chip. Test data input is passed to the test and diagnostics control logic through the use of the scan select, as with the other logic units. The control interface is configured to feed a stop control and scan control signal back to the free-running logic under control of stop enable and scan enable signals. Outputs are forced to an electrically safe value by shadowing the driver control register, which controls the functional output.

29 Claims, 6 Drawing Sheets

METHOD AND APPARATUS FOR SCANNING FREE-RUNNING LOGIC

BACKGROUND OF THE INVENTION

1. Technical Field

The present invention relates to an improved chip organization and, in particular, to a method and apparatus for scanning free-running logic. Still more particularly, the present invention provides a method and apparatus for scanning free-running logic that controls system pervasive functions while maintaining the state of the system that the free-running logic controls.

2. Description of Related Art

Prior art chip designs use macros to control the clocks to the chip plus provide the interface to an external service processor. These macros source the control for a scan function of the chip logic, and supply other pervasive control functions, such as built-in-self-test, off-chip-driver enable control, and boundary scan control. Scanning is a method for testing chips on a printed circuit board by building the chip with additional input and output pins that are only used for test purposes. Full scan methods test all the registers on the chip. Partial scan tests some of them, and boundary scan tests only the input/output cells.

With reference to FIG. 1, a block diagram is shown depicting a prior art processor chip with pervasive control functions. The chip 100 includes a logic function portion 101 and a test and diagnostics portion 102. The chip communicates with a service processor 130 through a joint test action group (JTAG) bus 140. JTAG is the Institute of Electrical and Electronics Engineers (IEEE) standard for boundary scan.

The logic function portion includes logic units 104, 106 and scan switch 108. For simplicity, the example in FIG. 1 shows only two logic units; however, logic function portion 101 typically includes many more logic units. The test and diagnostics portion includes test and diagnostics control logic 110, asynchronous interface logic 112, and a JTAG test clock (TCK) clock partition 114. The JTAG TCK partition includes data registers 116, instruction register 118, input/output (I/O) 120, and state machine 122. The test and diagnostics control logic is also referred to as the "free-running logic."

The term "logic unit" refers to a grouping of similar logic functions. Such a grouping of functions may also be referred to as a "cluster." For purposes of discussion, the test and diagnostic control logic is also referred to as a logic unit, namely the "free-running logic unit." The term "free-running" refers to the fact that the test and diagnostics control logic has clocks which conventionally never stop, because the logic controls the operation of the chip to do scanning when the clocks to the other logic units are stopped.

Test and diagnostics control logic 110 controls the scanning of logic units in the logic function portion through control interface 124. The service processor 130 receives test data input and test output through I/O 120. The service processor provides test clock through TCK and advances through states in state machine 122 through TMS. Test and diagnostics control logic 110 and logic units 104, 106 operate under a high-speed mesh clock (mclk). Asynchronous interface logic 112 provides an interface between the high-speed free-running logic and the slower test clock.

According to the 1149.1 IEEE JTAG specifications, instructions are loaded into instruction register 118 through the JTAG bus. TDI input serially shifts into an instruction-shift register based on the JTAG state machine, which itself is under the control of the JTAG TMS/TCK pins. When an instruction to scan a logic unit is in instruction register 118, the instruction is decoded to assert the appropriate scan select signal. The number "n" of scan select signal lines is equal to the number of logic units in logic function portion 101. The scan select signals are then used in scan switch 108 to forward the appropriate I/O signal from the logic units to I/O 120. The scan select signal is also used to select the appropriate logic unit for a write to a register through test data in (TDI).

A disadvantage of the prior art is that the test and diagnostics control logic is not itself scannable and so it lacks the very same system scan support that it provides to the functional units, such as an instruction unit, on the chip. The fact that the macros, which control the broad sweeping functions on the chip, like clocking, do not themselves support scanning and the setting of latches via scan presents a problem concerning usability of initial hardware if a circuit, mask, or logic problem ever manifests. As chips become more complex and the speeds of chips surpass the one gigaherz range, the ability of the test and diagnostics control logic to function properly is of increasing importance.

Thus, it would be advantageous to provide a method and apparatus for scanning the free-running logic in the test and diagnostics portion of a chip.

SUMMARY OF THE INVENTION

The present invention provides a method and apparatus for scanning the test and diagnostics control logic on a chip. The state of the chip logic is maintained in a frozen state as a scan of the normally free-running logic occurs. The chip is configured to select the test and diagnostics control logic if an instruction to scan the test and free-running logic is in the instruction register. A scan switch is configured to pass the scan output from the free-running logic to the test data output on the chip. Test data input is passed to the test and diagnostics control logic through the use of the scan select, as with the other logic units. The control interface is configured to feed a stop control and scan control signal back to the free-running logic under control of stop enable and scan enable signals. Outputs are forced to an electrically safe value by shadowing the driver control register, which controls the functional output.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The present invention described hereinbelow provides a chip configured to allow scanning of the test and diagnostics control logic in a manner similar to the scanning of the functional logic units on the chip. The test and diagnostics control logic, also referred to as the free-running logic, may be scanned, for example, for debugging or to set particular registers via scan. Thus, the operability of the logic used to control the functional logic units on the chip can be verified using the same set of instructions as those used for scanning the other logic units.

Figure 1:
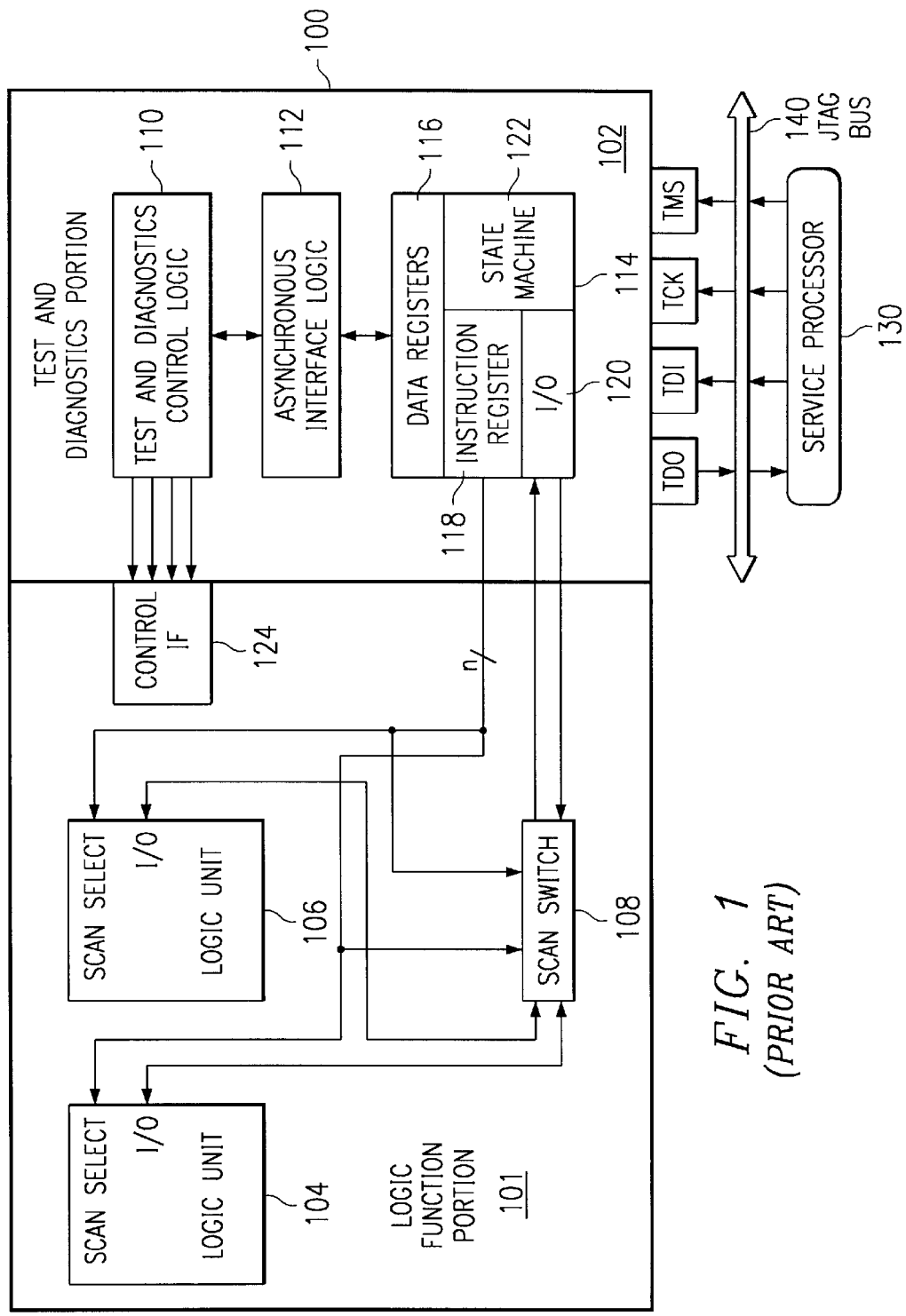
FIG. 1 is a block diagram depicting a prior art processor chip with pervasive control functions.
Figure 2:
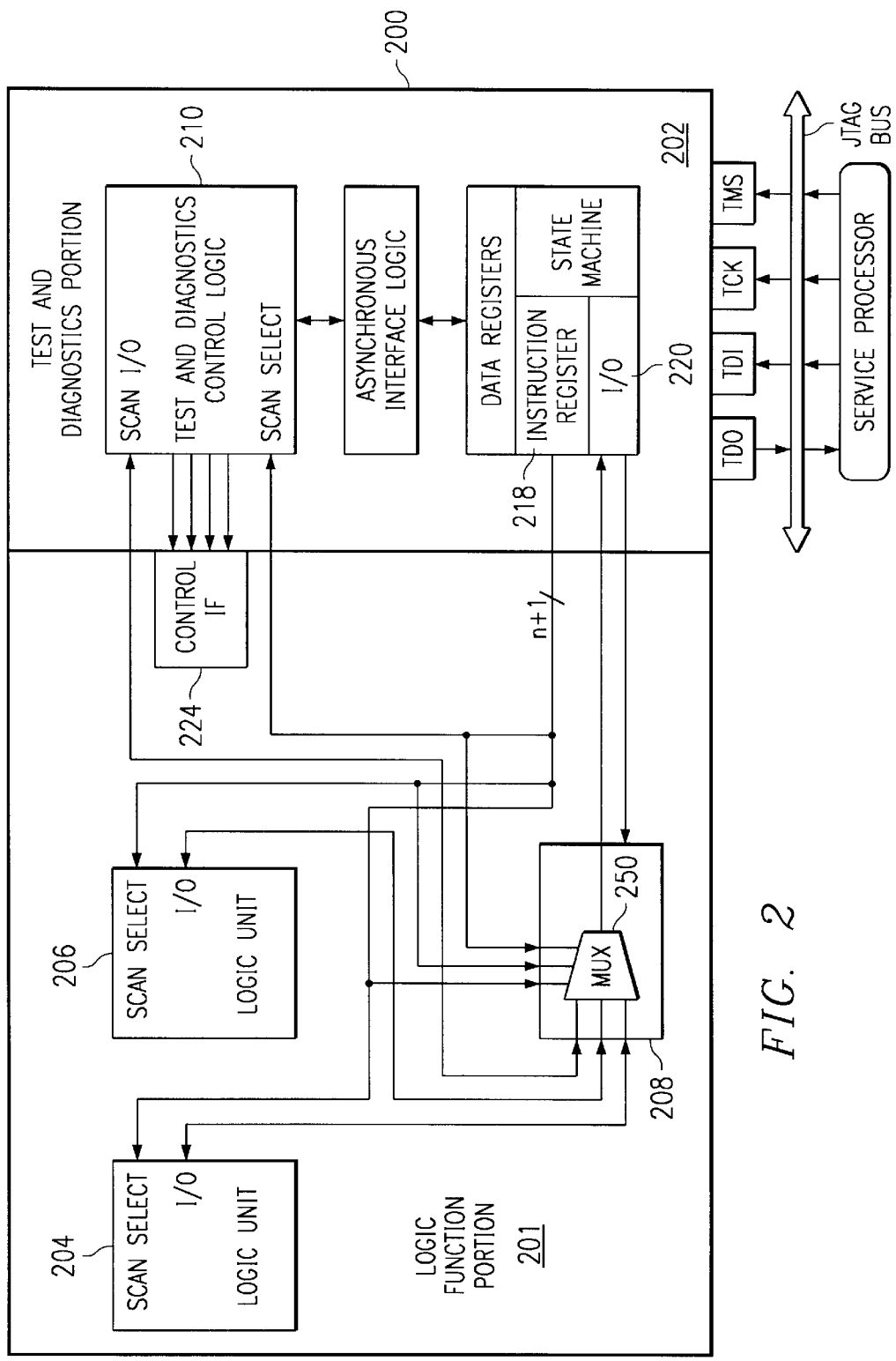
FIG. 2 is a block diagram depicting a processor chip configured to allow scanning of the free-running logic in accordance with a preferred embodiment of the present invention.

With reference to FIG. 2, a block diagram is shown depicting a processor chip configured to allow scanning of the free-running logic in accordance with a preferred embodiment of the present invention. The chip 200 includes a logic function portion 201 and a test and diagnostics portion 202. The chip communicates with a service processor through a JTAG bus. The logic function portion includes logic units 204, 206 and scan switch 208. For simplicity, the example in FIG. 2 shows only two logic units; however, logic function portion 201 typically includes many more logic units. The test and diagnostics portion includes test and diagnostics control logic 210, asynchronous interface logic, and a JTAG TCK partition. The JTAG TCK partition includes data registers, instruction register 218, input/output (I/O) 220, and a state machine. Test and diagnostics control logic 210 controls the scanning of logic units in the logic function portion through control interface 224.

When an instruction to scan the free-running logic is in instruction register 218, the instruction is decoded to assert the scan select signal of test and diagnostics control logic 210. Scan switch 208 includes multiplexor 250, which is configured to accept scan inputs from logic units 204, 206, as well as test and diagnostics control logic 210. The input of multiplexor 250 is selected by the scan select signals of the logic units and the test and diagnostics control logic. The output of the multiplexor is then sent to I/O 220.

However, to be able to scan the free-running control logic normally by the application of scan clocks, the system clocks to both the free-running and the chip logic must be stopped. Furthermore, system clocks to both the free-running control logic and to the entire chip must be stopped on exactly the same cycle. If all the clocks are not stopped on the same cycle, then potentially the combined state of the free-running logic and the chip may be different after the clocks are resumed than if clocks are not stopped at all.

The implementation to stop the free-running logic at the same time as the chip logic depends on allowing the stop signal to the chip logic into the free-running logic at the appropriate time. Since the free-running logic is generating the stop signal to the chip logic, the stop signal must be staged for an appropriate amount of time. The number of cycles to wait depends on the depth, in terms of cycles, that the stop-signal takes to arrive at the local clock buffers of the chip logic.

Figure 3:
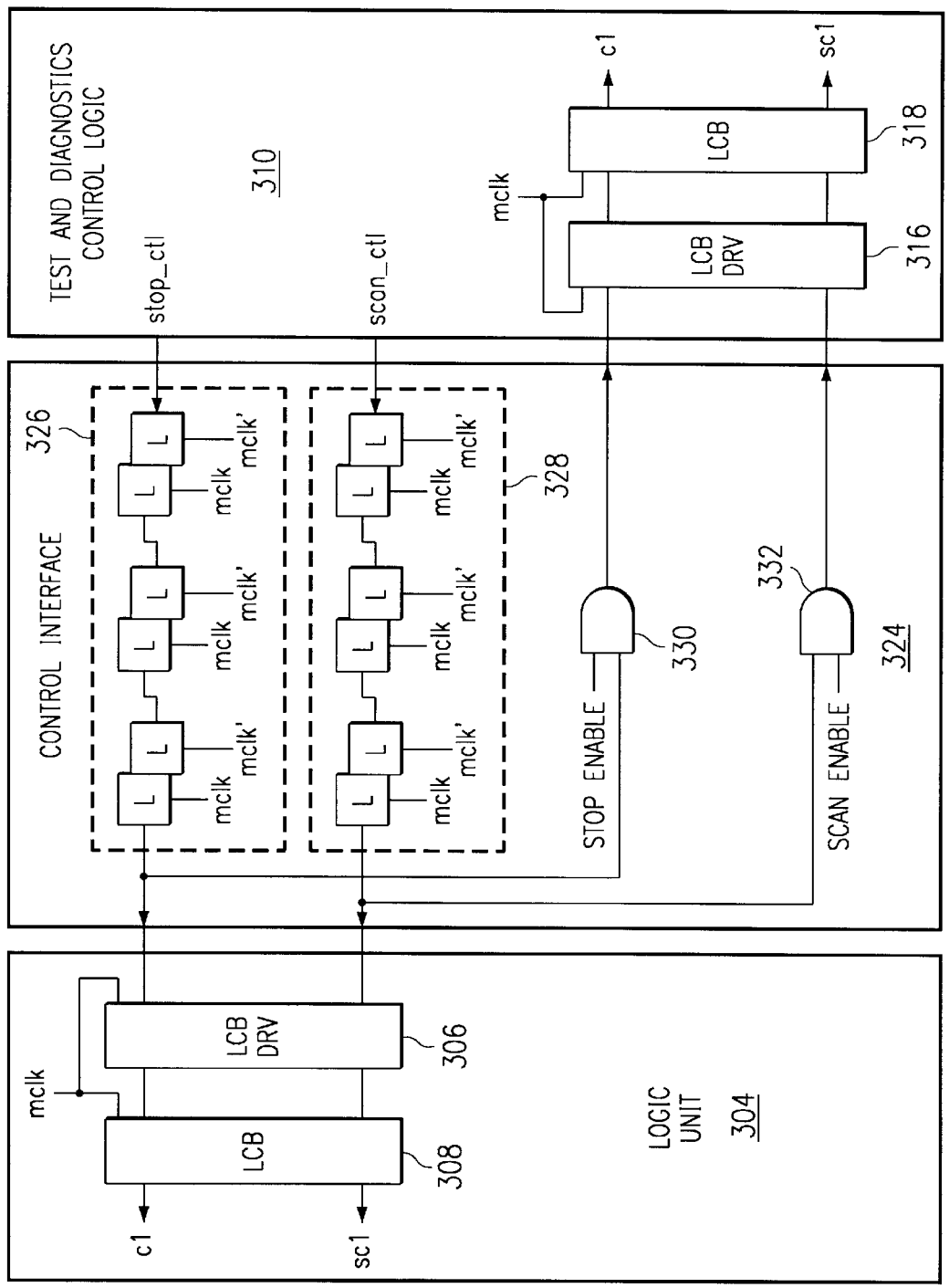
FIG. 3 is a block diagram illustrating communication between the test and diagnostics control logic and a logic unit through the control interface in accordance with a preferred embodiment of the present invention.

With reference now to FIG. 3, a block diagram is shown illustrating communication between the test and diagnostics control logic and a logic unit through the control interface in accordance with a preferred embodiment of the present invention. Test and diagnostics control logic 310 issues a stop control signal (stop_ctl) and a scan control signal (scan_ctl) to control interface 324. The stop control signal passes through pipeline 326 and the scan control signal passes through pipeline 328. The outputs of pipelines 326, 328 are passed to logic unit 304. For simplicity, the example shown in FIG. 3 includes only one logic unit; however, the outputs of the pipelines typically will be passed to all logic units.

The pipelines each include a series of latch pairs. Each pair of latches includes one latch operating under control of a shifted phase of the mesh clock (mclk') and another latch operating under control of the mesh clock (mclk), resulting in a slight delay. The number of pairs of latches may be increased or decreased to modify the resulting time delay at the output of each pipeline. In addition, each logic unit may include pipelines (not shown) at the stop control and scan control signal inputs to increase the delay.

The stop control signal and scan control signal inputs of logic unit 304 connect to local clock buffer (LCB) driver 306, which drives LCB 308. The LCB driver and the LCB are under control of the mesh clock. The outputs of the LCB are functional clock (c1) and scan clock (sc1).

In accordance with a preferred embodiment of the present invention, the outputs of pipelines 326, 328 are fed back through control interface 324 to test and diagnostics control logic 310. The stop control signal from pipeline 326 is connected to an input of AND gate 330 with a stop enable signal being the other input. The scan control signal from pipeline 328 is connected to an input of AND gate 332 with a scan enable signal being the other input. The stop enable and scan enable signals are asserted when an free-running logic scan instruction is detected in instruction register 218 in FIG. 2. Therefore, the free-running logic is not stopped unless a free-running logic scan is being performed.

The stop control signal and scan control signal inputs of test and diagnostics control logic 310 connect to local clock buffer (LCB) driver 316, which drives LCB 318, in a manner similar to logic unit 304.

Figure 4:
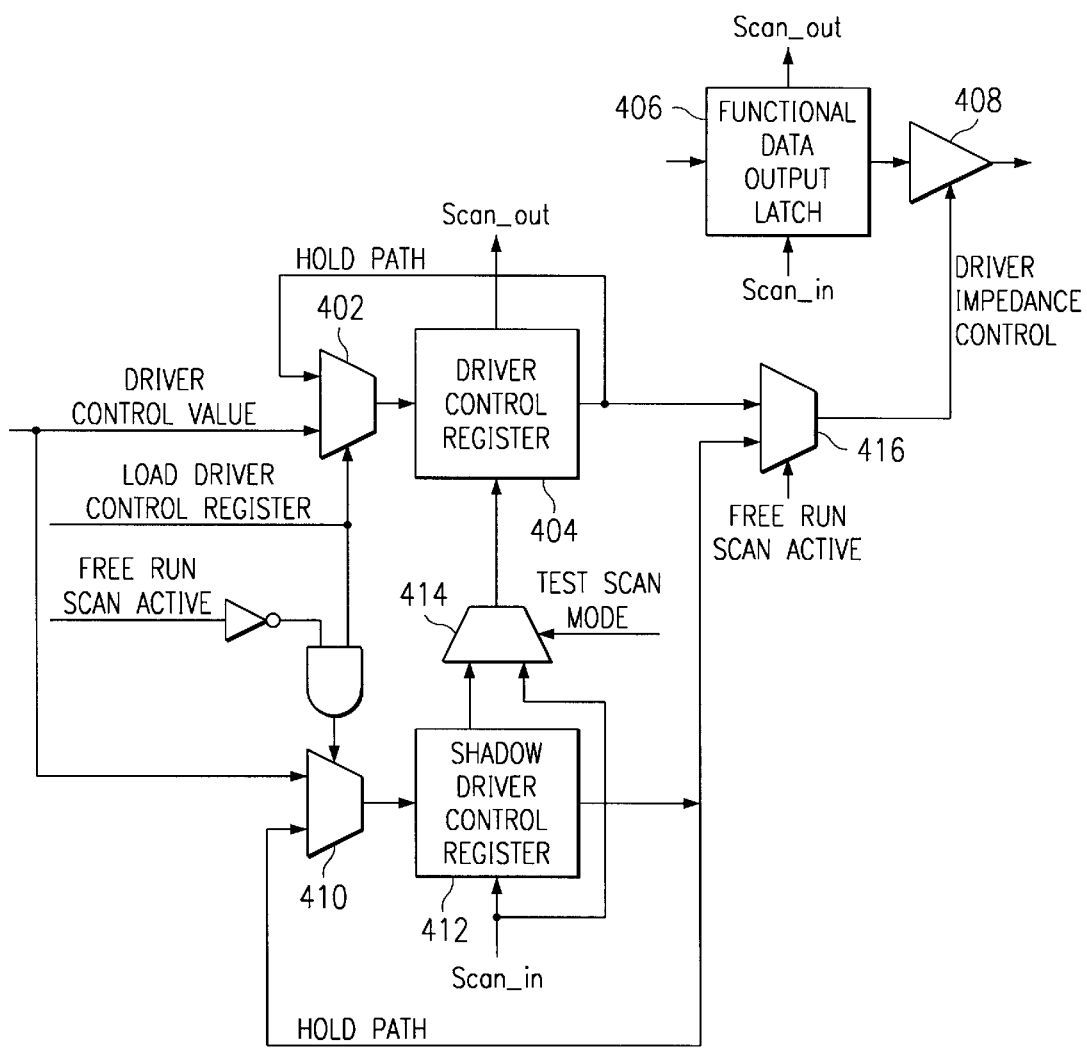
FIG. 4 is a diagram illustrating driver control circuitry according to a preferred embodiment of the present invention.

Turning now to FIG. 4, a diagram is shown illustrating driver control circuitry according to a preferred embodiment of the present invention. A driver control value is connected to the input of multiplexor 402. A load driver control register signal is connected to the selection pin of the multiplexor to determine whether the drover control value of a hold path from driver control register 404 is selected for input to the multiplexor. The output, in turn is connected to the input of the driver control register. If the load driver control register signal is not asserted, then the output of the driver control register continues to be fed back into the input. If the load driver control register signal is asserted, then the driver control value is passed to the input of the driver control register.

The output of functional output latch 406 is connected to the input of tri-state buffer 408. In prior art driver control circuitry, the output of driver control register 404 is connected directly to the enable pin of the tri-state buffer. Thus, if the output of the driver control register is not asserted, then the output of tri-state buffer 408 is set to a high impedance value. However, if the output of the driver control register is asserted, then the output of the tri-state buffer follows the input.

In accordance with a preferred embodiment of the present invention, a shadow, or copy, of the driver control register is provided to ensure that the driver impedance control value remains at a safe level during a scan of the free-running logic. Multiplexor 410 receives the driver control value signal and a hold path as inputs. The load driver control register and a logical NOT of a Free_Run_Scan_Active signal are connected to the inputs of an AND gate, the output of which is connected to the selection pin of multiplexor 410. Thus, if the Free_Run_Scan_Active signal is asserted, then the selection pin of the multiplexor is deasserted and the output of the multiplexor is the hold path and the load control signal may safely go to an undetermined value during the scan of the free-running logic. If the Free_Run_Scan_Active signal is not asserted, then the selection pin of multiplexor 410 is the load driver control register signal and multiplexor 410 and shadow driver control register 412 mirror multiplexor 402 and driver control register 404.

The mechanism for detecting the scan of the free-running logic is a super-set of the logic for scanning any given chain of the chip logic. When the decode of the scan chain modifier of the scan instruction, the scan chain select bits, identifies the free-running logic section and the JTAG state machine is in the Shift-DataRegister state, then the control signal is activated which effects operation for scanning the free-running control logic as described above. This control signal is referred to as the Free—Run—Scan—Active signal.

A scan_in signal is connected to the scan_in of shadow driver control register 412. The scan out of the shadow driver control register is connected to an input of multiplexor 414. The scan_in signal is also connected to the input of multiplexor 414. Tester scan mode signal is connected to the selection pin of the multiplexor. The output of the multiplexor is connected to the scan_in of driver control register 404. Register 404 is scanned only in the LSSD_TESTMODE. Multiplexor 414 is used to shunt the scan chain around the shadow register in the system scan mode, referred to as the free-running scan mode. During manufacturing tests, register 404 participates in the scan, but does not participate during the system scan of the free-running logic. The arrangement shown in FIG. 4 provides stable driver control values during the system scan of the free-running logic.

The outputs of driver control register 404 and shadow driver control register 412 are connected to the inputs of multiplexor 416. The Free_Run_Scan_Active signal is connected to the selection pin of the multiplexor. Thus, if the Free_Run_Scan_Active signal is not asserted, the output of multiplexor 416 is the output of the driver control register. If the Free_Run_Scan_Active signal is asserted the output of the multiplexor is the output of the shadow driver control register.

For simplicity, the example shown in FIG. 4 has a single input and a single output for each of the driver control register 404 and the shadow driver control register 412. However, a person of ordinary skill in the art will recognize that, typically, the driver control register has more than one input and output. For example, registers 404, 412 may be eight-bit registers, in which case the registers have eight different driver control values for eight different driver types or busses. The registers also have eight outputs to control the impedance of eight different buffers serving eight functional data output latches respectively.

Figure 5:
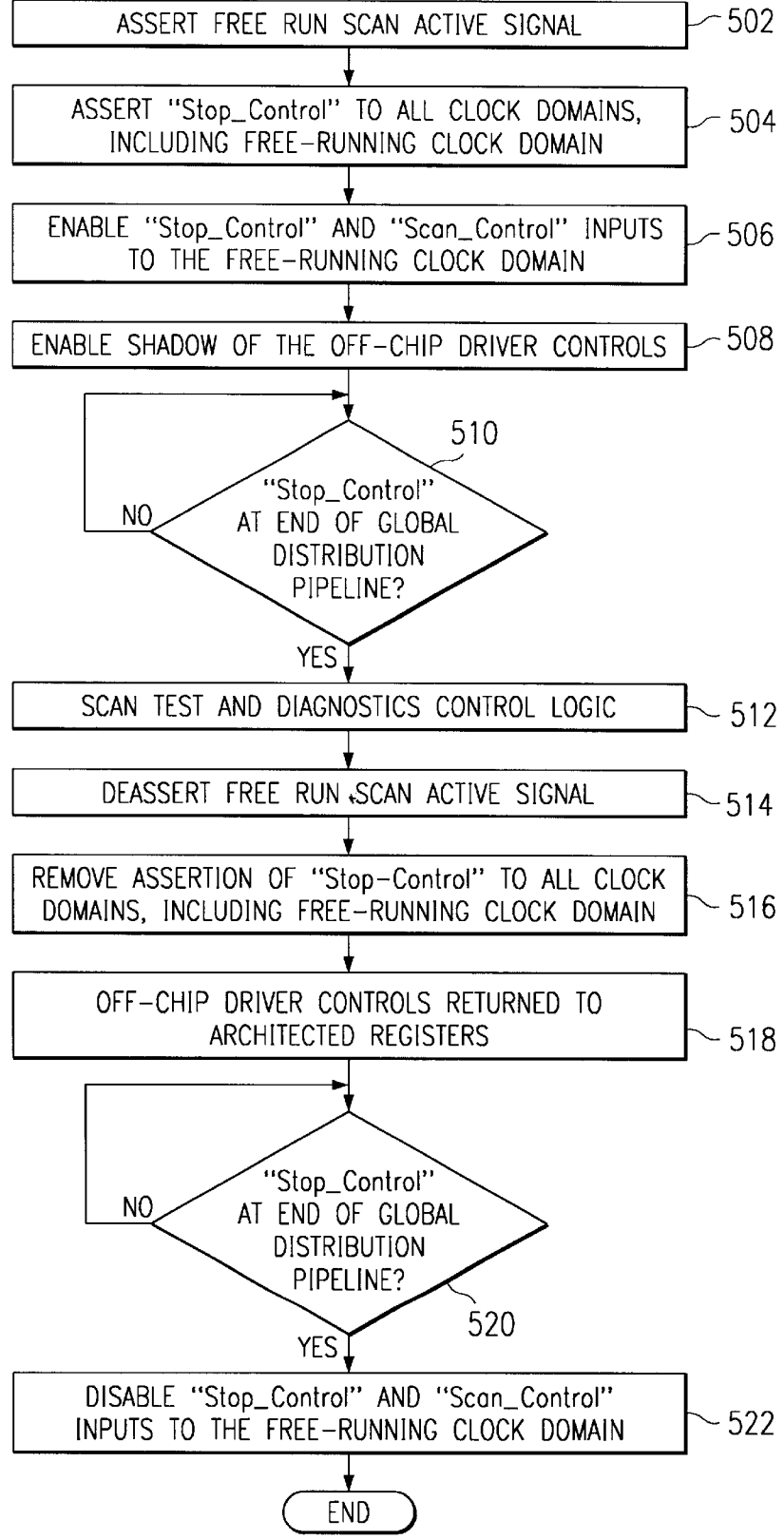
FIG. 5 is a flowchart illustrating a process for scanning the free-running logic according to a preferred embodiment of the present invention.

With reference now to FIG. 5, a flowchart is shown illustrating a process for scanning the free-running logic according to a preferred embodiment of the present invention. The process begins and asserts the Free Run Scan Active signal (step 502). The process asserts the stop_control signal to all clock domains, including the free-running clock domain (stop 504), and enables stop_control and scan_control inputs to the free-running clock domain (step 506) by asserting stop enable and scan enable signals in the control interface of FIG. 3. A "clock domain" is a partition of the chip logic with separate and independent clock stop controls. For instance, the I/O bus logic has a clock domain and the memory subsystem has a separate clock domain. The present invention adds a control for some of the logic in the test and diagnostics control logic. Therefore, the test and diagnostics control logic has its own clock stop control, thus its own clock domain, namely the "free-running clock domain."

Next, the process enables the shadow of the off-chip driver controls (step 508) and a determination is made as to whether the stop_control signal is at the end of the global distribution pipeline (step 510). If the stop_control signal is not at the end of the pipeline, the process returns to step 510 to wait until the signal reaches the end of the pipeline. The global distribution pipeline may be considered part of the control interface. Physically, the pipeline is dispersed throughout the chip. However, conceptually, the pipeline is part of control interface, as shown in FIG. 3.

If the stop_control signal is at the end of the global distribution pipeline in step 510, the process scans the test and diagnostic control logic (step 512). Thereafter, the process deasserts the Free Run Scan Active signal (step 514) and removes the assertion of stop_control to all clock domains, including the free-running clock domain (step 516).

Then, the process returns off-chip driver controls to architected registers (step 518). Because the last shift of the free-running logic scan chain, which includes the driver control register, occurs with the rising edge of the TCK clock, and because the free run scan active signal deasserts based on the falling edge of the TCK clock, the driver control register contents are stable when the free run scan active signal changes the select of multiplexor 416 in FIG. 4.

A determination is then made as to whether the stop_control is deasserted at the end of the global distribution pipeline (step 520). If the removal of the assertion of the stop control signal is not at the end of the pipeline, the process returns to step 520 to wait for the signal to reach the end of the pipeline. If the stop control signal is deasserted at the end of the global distribution pipeline in step 520, the process disables stop_control and scan_control inputs to the free-running clock domain (step 522) and the process ends.

Figure 6:
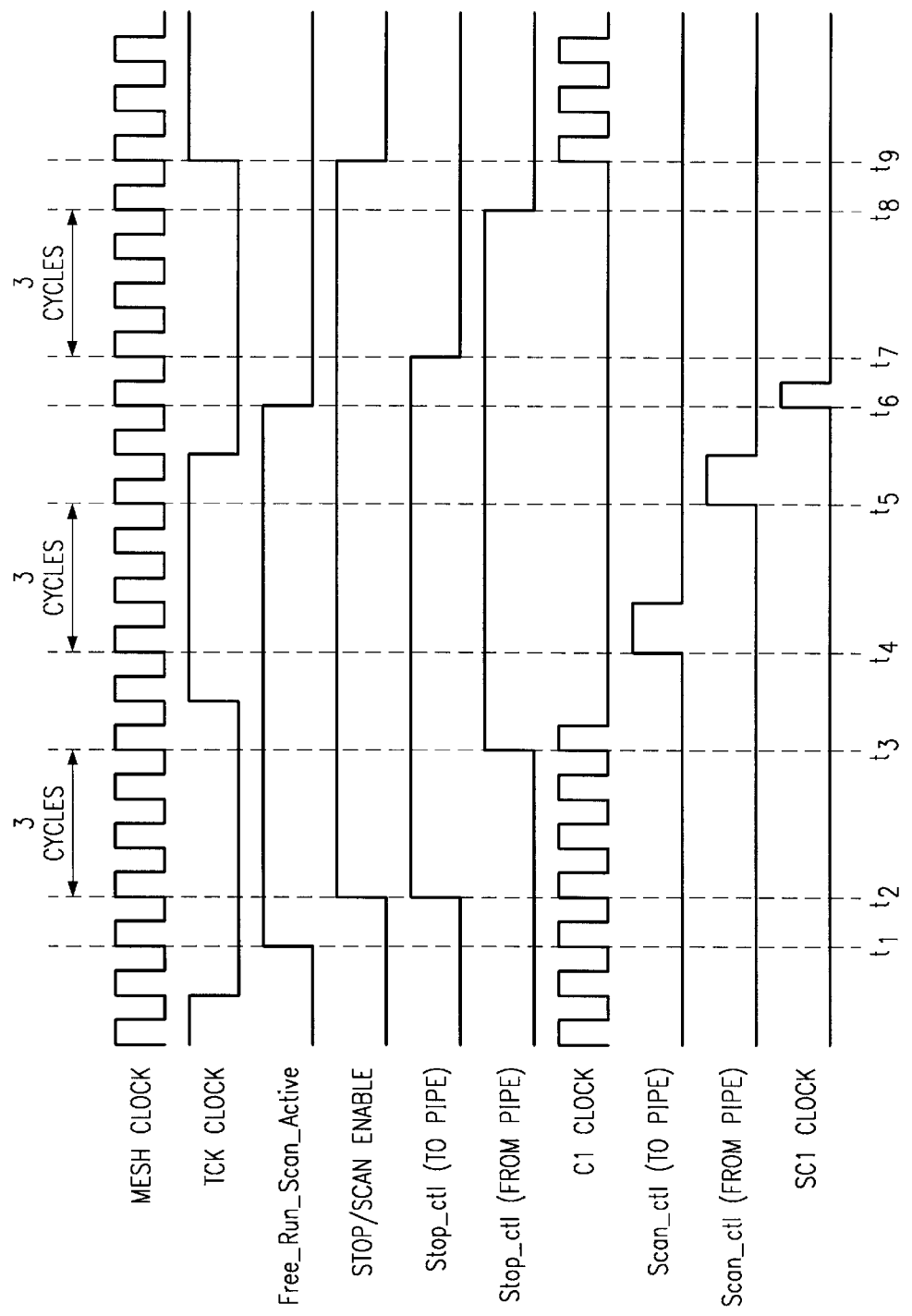
FIG. 6, a timing diagram illustrating the states of signals during a scan of the free-running logic in accordance with a preferred embodiment of the present invention.

With reference now to FIG. 6, a timing diagram illustrating the states of signals during a scan of the free-running logic in accordance with a preferred embodiment of the present invention. Operation begins with TCK clock and the high-speed mesh clock running. When a decode of a scan instruction indicates a scan of the free-running logic, the Free_Run_Scan_Active signal is asserted at time $t_1$. The Free_Run_Scan_Active signal is asserted based on the next falling edge of the TCK clock as the JTAG Shift-DataRegister state is entered. As seen in FIG. 6, a delay occurs between the falling edge of the TCK clock and the assertion of the Free_Run_Scan_Active signal. This is due to a delay in the asynchronous interface. The delay shown here is one mesh clock cycle; however, the delay may be three high-speed clock cycles or more. On the next cycle, the stop enable and scan enable signals are asserted, which enables the stop control and scan control inputs to the free-running clock domain, at time $t_2$.

Also at time $t_2$, the stop_ctl signal is asserted at the beginning of pipeline 326 in control interface 324 in FIG. 3. After three mesh clock cycles, stop_ctl at the end of the pipeline is asserted at time $t_3$ and the c1 clock finishes its cycle and stops. At the next rising edge of the TCK clock, at time $t_4$, the scan_ctl signal is asserted at the beginning of pipeline 328. Again, a delay of one mesh clock cycle is shown here; however, the delay may be three high-speed clock cycles or more. After three mesh clock cycles, scan_ctl at the end of the pipeline is asserted at time $t_5$ and the sc1 clock is asserted for a pulse at time $t_6$.

The test and diagnostics control logic continues to assert a scan_ctl pulse at each rising edge of the TCK clock until the Free_Run_Scan_Active signal is deasserted. For simplicity, the example shown in FIG. 6 shows only one scan pulse; however, scan pulses may continue for several TCK clock cycles. In the current example, the Free_Run_Scan_Active signal is deasserted after one TCK clock cycle at time $t_6$. On the next mesh clock cycle at time $t_7$, stop_ctl at the beginning of pipeline 326 is deasserted. After three mesh clock cycles, stop ctl at the end of the pipeline is deasserted at time $t_8$. On the following clock cycle at time $t_9$, the stop enable and scan enable signals are deasserted and the c1 clock is restarted.

A number of latches in the free-running control logic are not scanned, namely, the latches controlling the scan operation itself. The shadow driver control register also is excluded from the scan of the free-running logic. The design is structured to minimize this number. These latches specifically are those which are involved in the loading and decoding of the scan instruction, the JTAG state machine, the meta-stability latches for the Free—Run—Scan—Active signal, and of course the pipelined clock control signals for stop and scan control inputs of the local clock buffers. Since these latches are not scanned, they are designed to maintain their intended functions during a scan of the free-running logic.

The special controls for the free-running logic latches which are not part of the scan operation of free-running logic simplify to an LSSD-TESTMODE pin into the chip which causes the clock control for the system non-scan latches, those controlling the scan of the free-running logic, to be stoppable and scannable during the level sensitive scan design (LSSD) test mode. Outside of the LSSD test mode, the clocks to these latches cannot be stopped and the scan input to this group of latches is bypassed to its scan output to effectively shunt, or skip over, these latches.

The present invention solves the disadvantages of the prior art by allowing the free-running logic to be scanned. Thus, the test and diagnostics control logic itself may be debugged. The present invention allows scanning of the free-running logic by connecting the I/O pin and scan select pin of the test and diagnostics control logic to a multiplexor in the scan switch. The control interface is modified to feed stop control and scan control signals to the free-running logic and stages the signals to match the timing of the signals to the functional logic units. The present invention also forces outputs to an electrically safe value by shadowing the driver control register, which controls the functional output.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of scanning a logic unit on a chip, wherein the logic unit includes functional logic and scan control logic, comprising:

receiving an instruction to test the scan control logic; and scanning the scan control logic in response to receiving the instruction in order to test the scan control logic.

2. The method of claim 1, further comprising:

asserting a scan active signal in response to receiving the instruction; and enabling a shadow of off chip driver controls in response to the scan active signal, before scanning the scan control logic.

3. The method of claim 1, further comprising:

asserting a stop enable signal in response to receiving the instruction;

asserting a stop control signal; and stopping a clock in the scan control logic in response to the assertion of the stop enable signal and the assertion of the stop control signal, before scanning the scan control logic.

4. The method of claim 3, wherein the step of asserting a stop control signal comprises:

asserting a stop control input signal at the beginning of a pipeline; and receiving a stop control output signal at the end of the pipeline, wherein assertion of the stop control output signal is delayed relative to the assertion of the stop control input signal.

5. The method of claim 1, wherein the step of scanning the scan control logic comprises:

generating a scan control pulse; and scanning a latch in the scan control logic in response to the scan control pulse.

6. The method of claim 5, wherein the step of scanning the free-running logic comprises:

asserting a scan control input pulse at the beginning of a pipeline; and receiving a scan control output pulse at the end of the pipeline, wherein assertion of the scan control output pulse is delayed relative to the assertion of the scan control input pulse.

7. A method for testing logic in a scan control logic domain, comprising:

asserting a stop control signal to the scan control logic domain;

scanning the logic in the scan control logic domain to test the logic; and deasserting the stop control signal to the scan control logic domain.

8. The method of claim 7, further comprising:

asserting a scan active signal before asserting a stop control signal to the scan control logic domain; and enabling a shadow of off chip driver controls in response to the scan active signal.

9. The method of claim 7, wherein the step of asserting the stop control signal comprises:

asserting a stop control input signal at the beginning of a pipeline; and receiving a stop control output signal at the end of the pipeline, wherein assertion of the stop control output signal is delayed relative to the assertion of the stop control input signal.

10. The method of claim 7, wherein the step of scanning the logic in the scan control logic domain comprises:

generating a scan control pulse; and scanning a latch in the logic in response to the scan control pulse.

11. The method of claim 10, wherein the step of generating a scan control pulse comprises:

asserting a scan control input pulse at the beginning of a pipeline; and receiving a scan control output pulse at the end of the pipeline, wherein assertion of the scan control output pulse is delayed relative to the assertion of the scan control input pulse.

12. The method of claim 7, wherein the step of deasserting the stop control signal comprises:

deasserting the stop control input signal at the beginning of a pipeline; and receiving a stop control output signal at the end of the pipeline, wherein deassertion of the stop control output signal is delayed relative to the deassertion of the stop control input signal.

13. A method for scanning free-running logic in a chip, comprising:

enabling a shadow of off-chip driver controls;

scanning the free-running logic; and returning the off-chip driver controls to architected registers.

14. An apparatus for scanning a logic unit on a chip, wherein the logic unit includes functional logic and scan control logic, comprising:

receipt means for receiving an instruction to test the scan control logic; and scan means for scanning the scan control logic in response to receiving the instruction in order to test the scan control logic.

15. The apparatus of claim 14, further comprising:

means for asserting a scan active signal in response to receiving the instruction; and means for enabling a shadow of off chip driver controls in response to the scan active signal, before scanning the scan control logic.

16. The apparatus of claim 14, further comprising:

means for asserting a stop enable signal in response to receiving the instruction;

means for asserting a stop control signal; and means for stopping a clock in the scan control logic in response to the assertion of the stop enable signal and the assertion of the stop control signal, before scanning the scan control logic.

17. The apparatus of claim 14, wherein the scan means comprises:

means for generating a scan control pulse; and means for scanning a latch in the scan control logic in response to the scan control pulse.

18. An apparatus for testing logic in a scan control logic domain, comprising:

means for asserting a stop control signal to the scan control logic domain;

means for scanning the logic in the scan control logic domain to test the logic; and means for deasserting the stop control signal to the scan control logic domain.

19. The apparatus of claim 18, further comprising:

means for asserting a scan active signal before asserting a stop control signal to the scan control logic domain; and means for enabling a shadow of off chip driver controls in response to the scan active signal.

20. The apparatus of claim 18, further comprising:

means for asserting a stop enable signal in response to receiving the instruction; and means for stopping a clock in the scan control logic domain in response to the assertion of the stop enable signal and the assertion of the stop control signal, before scanning the logic.

21. The apparatus of claim 18, wherein the means for scanning the logic in the scan control logic domain comprises:

means for generating a scan control pulse; and means for scanning a latch in the logic in response to the scan control pulse.

22. The apparatus of claim 21, wherein the means for generating a scan control pulse comprises:

means for asserting a scan control enable signal;

means for receiving a scan control signal; and means for generating the scan control pulse in response to assertion of the scan control enable signal and assertion of the scan control signal.

23. A method for scanning free-running logic in a chip, comprising:

means for enabling a shadow of off-chip driver controls;

means for scanning the free-running logic; and means for returning the off-chip driver controls to architected registers.

24. A chip comprising:

a plurality of logic units including at least one functional logic unit and a test and diagnostics control logic unit; and a scan switch that selects a scan output of the test and diagnostics control logic unit in response to an instruction to scan the test and diagnostics control logic unit.

25. The chip of claim 24, further comprising:

a control interface that enables a stop control signal input to the test and diagnostics control logic unit, wherein a clock to the test and diagnostics control logic unit stops in response to assertion of the stop control signal.

26. The chip of claim 25, further comprising:

a pipeline that delays the stop control signal.

27. The chip of claim 25, wherein the control interface includes a logic gate that enables the stop control signal in response to assertion of a stop enable signal.

28. The chip of claim 24, further comprising:

a driver control register; and a shadow driver control register that shadows the driver control register, wherein the shadow driver control register controls off-chip drivers during a scan of the test and diagnostics control logic.

29. The chip of claim 24, wherein the scan switch comprises a multiplexor.

* * * * *